(12) United States Patent
Juliano et al.

(10) Patent No.: US 8,338,214 B2
(45) Date of Patent: Dec. 25, 2012

(54) SODIUM SALT CONTAINING CIG TARGETS, METHODS OF MAKING AND METHODS OF USE THEREOF

(75) Inventors: Daniel R. Juliano, Santa Clara, CA (US); Robert Tas, Aromas, CA (US); Neil Mackie, Fremont, CA (US); Abdelouahab Ziani, Santa Clara, CA (US)

(73) Assignee: MiaSole, Santa Clara, CA (US)

( * ) Notice: Subject to any disclaimer, the term of this patent is extended or adjusted under 35 U.S.C. 154(b) by 0 days.

(21) Appl. No.: 13/073,159

(22) Filed: Mar. 28, 2011

(65) Prior Publication Data

US 2012/0094429 A1 Apr. 19, 2012

Related U.S. Application Data

(63) Continuation of application No. 12/907,595, filed on Oct. 19, 2010, now Pat. No. 7,935,558.

(51) Int. Cl.
*H01L 31/032* (2006.01)

(52) U.S. Cl. ............. 438/62; 204/298.13; 257/E31.028

(58) Field of Classification Search .................. 438/46, 438/62, 77, 93, 95, 102; 204/298.12, 298.13; 257/E31.027, E31.028
See application file for complete search history.

(56) References Cited

U.S. PATENT DOCUMENTS

| | | | |
|---|---|---|---|
| 4,027,367 A * | 6/1977 | Rondeau | 428/652 |
| 4,356,073 A | 10/1982 | McKelvey | |
| 4,915,745 A | 4/1990 | Pollock et al. | |
| 5,040,589 A * | 8/1991 | Bradley et al. | 164/113 |
| 5,435,965 A | 7/1995 | Mashima et al. | |
| 5,522,535 A | 6/1996 | Ivanov et al. | |
| 5,626,688 A * | 5/1997 | Probst et al. | 136/265 |
| 5,728,231 A | 3/1998 | Negami et al. | |
| 5,814,195 A | 9/1998 | Lehan et al. | |
| 5,904,966 A | 5/1999 | Lippens | |
| 6,020,556 A | 2/2000 | Inaba et al. | |
| 6,310,281 B1 | 10/2001 | Wendt et al. | |
| 6,372,538 B1 | 4/2002 | Wendt et al. | |
| 6,500,733 B1 | 12/2002 | Stanbery | |
| 6,525,264 B2 | 2/2003 | Ouchida et al. | |
| 6,559,372 B2 | 5/2003 | Stanbery | |
| 6,593,213 B2 | 7/2003 | Stanbery | |
| 6,690,041 B2 | 2/2004 | Armstrong et al. | |

(Continued)

FOREIGN PATENT DOCUMENTS

JP 11-274534 10/1999

(Continued)

OTHER PUBLICATIONS

Bodegard et al., "The Influence of Sodium on the Grain Structure of $CuInSo_2$ Films for Photovoltaic Applications," $12^{th}$ European Photovoltaic Solar Energy Conference, Proceedings of the International Conference, Amsterdam, The Netherlands, Apr. 11-15, 1994, Hill et al., Ed., vol. II, 1743-1746.

(Continued)

*Primary Examiner* — Julio J Maldonado
*Assistant Examiner* — Daniel Shook
(74) *Attorney, Agent, or Firm* — The Marbury Law Group PLLC

(57) ABSTRACT

A sputtering target includes at least one metal selected from copper, indium and gallium and a sodium containing compound.

21 Claims, 5 Drawing Sheets

U.S. PATENT DOCUMENTS

| | | | |
|---|---|---|---|
| 6,736,986 | B2 | 5/2004 | Stanbery |
| 6,750,394 | B2 | 6/2004 | Yamamoto et al. |
| 6,787,692 | B2 | 9/2004 | Wada et al. |
| 6,797,874 | B2 | 9/2004 | Stanbery |
| 6,822,158 | B2 | 11/2004 | Ouchida et al. |
| 6,852,920 | B2 | 2/2005 | Sager et al. |
| 6,878,612 | B2 | 4/2005 | Nagao et al. |
| 6,881,647 | B2 | 4/2005 | Stanbery |
| 6,936,761 | B2 | 8/2005 | Pichler |
| 6,987,071 | B1 | 1/2006 | Bollman et al. |
| 7,045,205 | B1 | 5/2006 | Sager |
| 7,115,304 | B2 | 10/2006 | Roscheisen et al. |
| 7,122,392 | B2 | 10/2006 | Morse |
| 7,122,398 | B1 | 10/2006 | Pichler |
| 7,141,449 | B2 | 11/2006 | Shiozaki |
| 7,148,123 | B2 | 12/2006 | Stanbery |
| 7,163,608 | B2 | 1/2007 | Stanbery |
| 7,194,197 | B1 | 3/2007 | Wendt et al. |
| 7,196,262 | B2 | 3/2007 | Gronat |
| 7,227,066 | B1 | 6/2007 | Roscheisen et al. |
| 7,235,736 | B1 | 6/2007 | Buller et al. |
| 7,247,346 | B1 | 7/2007 | Sager et al. |
| 7,253,017 | B1 | 8/2007 | Roscheisen et al. |
| 7,259,322 | B2 | 8/2007 | Gronet |
| 7,262,392 | B1 | 8/2007 | Miller |
| 7,267,724 | B2 | 9/2007 | Tanaka et al. |
| 7,271,333 | B2 | 9/2007 | Fabick et al. |
| 7,291,782 | B2 | 11/2007 | Sager et al. |
| 7,306,823 | B2 | 12/2007 | Sager et al. |
| 7,319,190 | B2 | 1/2008 | Tuttle |
| 7,374,963 | B2 | 5/2008 | Basol |
| 7,544,884 | B2 * | 6/2009 | Hollars .......................... 136/256 |
| 7,785,921 | B1 | 8/2010 | Juliano et al. |
| 2005/0109392 | A1 | 5/2005 | Hollars |
| 2006/0000705 | A1 | 1/2006 | Hartig et al. |
| 2006/0219288 | A1 | 10/2006 | Tuttle |
| 2007/0074969 | A1 | 4/2007 | Simpson et al. |
| 2007/0074970 | A1 * | 4/2007 | Purdy et al. ............... 204/298.12 |
| 2007/0283996 | A1 | 12/2007 | Hachtmann et al. |
| 2007/0283997 | A1 | 12/2007 | Hachtmann et al. |
| 2007/0289624 | A1 | 12/2007 | Kuriyagawa et al. |
| 2008/0000518 | A1 | 1/2008 | Basol |
| 2008/0000519 | A1 | 1/2008 | Takahashi |
| 2008/0142071 | A1 | 6/2008 | Dorn et al. |
| 2008/0169025 | A1 | 7/2008 | Basol et al. |
| 2008/0283389 | A1 | 11/2008 | Aoki |
| 2008/0314432 | A1 | 12/2008 | Paulson et al. |
| 2009/0014049 | A1 | 1/2009 | Gur et al. |
| 2009/0014057 | A1 | 1/2009 | Croft et al. |
| 2009/0014058 | A1 | 1/2009 | Croft et al. |
| 2009/0145746 | A1 | 6/2009 | Hollars |
| 2009/0199894 | A1 | 8/2009 | Hollars et al. |
| 2009/0260670 | A1 | 10/2009 | Li |
| 2010/0059385 | A1 | 3/2010 | Li |
| 2010/0108503 | A1 | 5/2010 | Bartholomeusz et al. |
| 2010/0133093 | A1 | 6/2010 | Mackie et al. |
| 2010/0212732 | A1 | 8/2010 | Schmidt et al. |
| 2010/0212733 | A1 | 8/2010 | Schmidt |
| 2010/0227066 | A1 * | 9/2010 | Chung .......................... 427/256 |
| 2010/0258191 | A1 | 10/2010 | Mackie et al. |

FOREIGN PATENT DOCUMENTS

| | | |
|---|---|---|
| JP | 11-298016 | 10/1999 |
| JP | 2006-165386 | 6/2006 |
| KR | 10-0743923 | 7/2007 |
| KR | 10-2009-0034078 | 4/2009 |

OTHER PUBLICATIONS

Contreras et al., "On the Role of Na & Modifications to Cu(In,Ga)Se$_2$ Absorber Materials Using Thin-MF (M=Na, K, Cs) Precursor Layers," 26$^{th}$ IEEE PVSC, Anaheim, CA, Sep. 30-Oct. 3, 1997, 359-362.

Devaney et al, "Recent Improvement in CuInSe$_2$/ZnCdS Thin Film Solar Cell Efficiency," 18$^{th}$ IEEE Photovoltaic Spec. Conf., 1985, New York, 1733-1734.

Evbuomwan et al., "Concurrent Materials and Manufacturing Process Selection in Design Function Deployment," Concurrent Engineering: Research & Applications, Jun. 1995, 3(2): 135-144.

Granath et al., "Mechanical Issues of NO Back Contracts for Cu(In,Ga)Se$_2$ Devices," 13$^{th}$ European Photovoltaic Solar Energy Conference, Proceedings of the International Conference, Nice, France, Oct. 23-27, 1995, Freiesieben et al., Ed., vol. II, 1983-1986.

Hedstrom et al., "ZnO/CdS/Cu(In,Ga)Se$_2$ Thin Film Solar Cells with Improved Performance," 23$^{rd}$ IEEE Photovoltaic Specialists Conference, Louisville, KY, May 10-14, 1993, 364-371.

Mickelsen et al., "High Photocurrent Polycrystalline Thin-Film CdS/CuInSe$_2$ Solar Cell," Appl. Phys. Letters, Mar. 1, 1980, 36(5):371-373.

Mohamed et al., "Correlation Between Structure, Stress and Optical Properties in Direct Current Sputtered Molybdenum Oxide Films," Thin Solid Films, 2003, 429:135-143.

Probst et al., "The Impact of Controlled Sodium Incorporated on Rapid Thermal Processed Cu(InGa)Se$_2$ thin Films and Devices," First WCPEC, Hawaii, Dec. 5-9, 2004, 144-147.

Ramanath et al., "Properties of 19.2% Efficiency ZnO/CdS/CuInGaSe$_2$ Thin-Film Solar Cells," Progress in Photovoltaics: Research and Applications, 2003, 11:225-230.

Rau et al., "Cu(In,Ga)Se$_2$ Solar Cells," Clean Electricity from Photovoltaics, Series on Photoconversion of Solar Energy, vol. 1, 2001, Archer et al., Ed., Chapter 7, 277-345.

Rudmann et al., "Effects of NaF Co-evaporation on Structural Properties of Cu(In,Ga)Se$_2$ Thin Films," Thin Solid Films, 2003, 431-432:37-40.

Sakurai et al., "Properties of Cu(In,Ga)Se$_2$:Fe Thin Films for Solar Cells," Mater. Res. Soc. Symp., Proc., 2005, 865:F14.12.1-F.1412.5.

Scofield et al., "Sodium Diffusion, Selenization, and Microstructural Effects Associated with Various Molybdenum Back Contact Layers for Cis-based Solar Cells," Proc. of the 24$^{th}$ IEEE Photovoltaic Specialists Conference, New York, NY, 1995, 164-167.

So et al., "Properties of Reactively Sputtered Mo$_{1-x}$O$_x$ Films," Appl. Phys. A., 1988, 45:265-270.

Stolt et al., "ZnO/CdS/CuInSe$_2$ Thin Film Solar Cells with Improved Performance," Appl. Phys. Letters, Feb. 8, 1993, 62(6):597-599.

Wlndischmann, "Intrinsic Stress in Sputter-Deposited Thin Films," Critical Reviews in Solid State and Materials Science, 1992, 17(6):547-596.

Yun et al., "Fabrication of CIGS Solar Cells with a Na-doped Mo layer on a Na-free Substrate," Thin Solid Films, 2007, 515:5876-5879.

International Search Report & Written Opinion, PCT/US2010/030454, (ISA/KR), Nov. 12, 2010.

International Search Report & Written Opinino, PCT/US2010/030456, (ISA/KR), Nov. 17, 2010.

U.S. Appl. No. 12/907,551, filed Oct. 19, 2010, 26pgs.

U.S. Appl. No. 12/907,652, filed Oct. 19, 2010, 26pgs.

International Search Report & Written Opinion issued in PCT Application No. PCT/US2011/056689, mailed on May 14, 2012.

* cited by examiner

SODIUM SALT CONTAINING CIG TARGETS, METHODS OF MAKING AND METHODS OF USE THEREOF

FIELD

The present invention is directed to sputtering targets and more particularly to methods of making the targets and using the targets to make copper-indium-gallium-selenide solar cells.

BACKGROUND

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

SUMMARY

An embodiment relates to a sputtering target which includes at least one metal selected from copper, indium and gallium and a sodium containing compound.

Another embodiment relates to a method of making a sputtering target. The method includes providing onto a target support a sodium compound containing material and at least one metal selected from a group consisting of copper, indium and gallium to form the target.

Another embodiment relates to a method of making a photovoltaic device. The method includes forming a compound semiconductor layer comprising copper, indium, gallium, selenium and sodium by reactive sputtering at least one first target including copper, indium, gallium and a sodium compound in an atmosphere comprising selenium.

DETAILED DESCRIPTION

Figure 1:
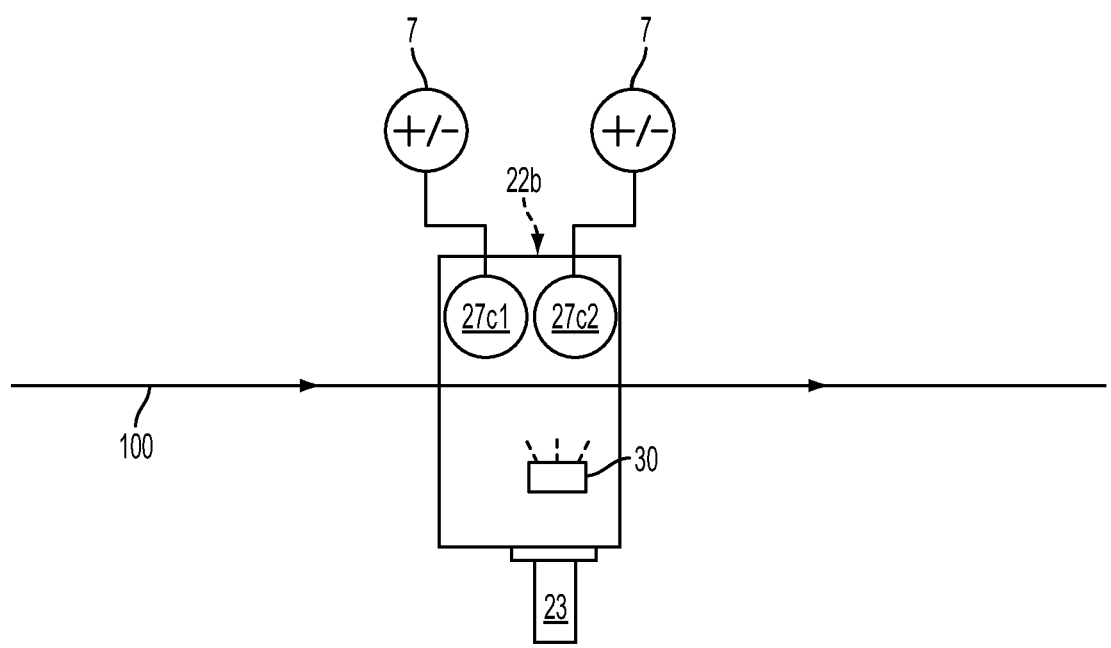
FIG. 1 illustrates a highly simplified schematic diagram of a top view of a sputtering apparatus that can be used for forming a compound semiconductor layer comprising copper, indium, gallium, selenium and sodium.

As grown copper indium diselenide based films are intrinsically p-type. However, it was found that a small amount of sodium dopants in copper indium diselenide based films (e.g. copper indium gallium diselenide films) increases the p-type conductivity of the copper indium gallium diselenide film and the open circuit voltage, and in turn, improves the efficiency of the solar cell. For example, Ramanathan (Ramanathan et al., Prog. Photovolt. Res. Appl. 11 (2003) 225, incorporated herein by reference in its entirety) teaches that a solar cell, having an efficiency as high as 19.5%, may be obtained by using a soda-lime glass substrate in combination with depositing a copper indium diselenide film under a high growth temperature. This method significantly improves the efficiency of a traditional solar cell by diffusing sodium from the glass substrate into the copper indium diselenide film. However, it is difficult to control the amount of the sodium provided to the copper indium diselenide based film and the speed of the sodium diffusion from a glass substrate. Furthermore, unlike glass substrates, other substrates, such as metal and plastic substrates, do not provide such a readily available supply of sodium.

Rudmann (Rudmann et al., Thin Solid Films 32 (2003) 37) teaches forming a NaF or NaSe layer between the copper indium gallium diselenide layer and a first electrode (also referred as a back electrode). Sodium doping in this system can be controlled by modulating the sodium diffusion from the NaF or NaSe layer into the copper indium gallium diselenide layer. Although the amount of sodium in copper indium gallium diselenide may be more controllable than in the Ramanathan method, the NaF or NaSe interlayer results in a poor adhesion and a greater schottky barrier between the copper indium gallium diselenide layer and the first electrode.

Yun (Yun et al., Thin Solid Films 515(2007) 5876-5879) teaches DC sputtering a sodium-containing molybdenum layer from a composite Na—Mo target. It has been found that resulting solar cells have an improved efficiency because the sodium incorporation enhances the open circuit voltage and fill factor. However, this method is limited by the property of the Na—Mo target, which has a high propensity to crack.

Embodiments of the present invention include sputtering targets which are useful in the fabrication of photovoltaic devices, methods of making photovoltaic devices with these targets and the photovoltaic devices themselves. One embodiment is a sputtering target which includes a sodium containing compound in a copper-indium-gallium matrix. The sputtering target of this embodiment may be used in the fabrication of a p-type copper indium gallium sodium diselenide layer of a photovoltaic device. Another embodiment includes sputtering targets which include a sulfur containing compound. This embodiment includes targets with indium, copper-indium, or copper-indium-gallium matrices. The sputtering targets of this embodiment may also be used in the fabrication of a p-type copper indium gallium sulfur diselenide layer of a photovoltaic device. In an alternative embodiment, both sodium and sulfur containing compounds can be added to the same sputtering target. As in the previous embodiment, the sputtering target of this embodiment may be used to form a p-type copper indium gallium sodium sulfur diselenide layer of a photovoltaic device.

Still another embodiment is a method of making an n-type window layer of a photovoltaic device by sputtering with a target which includes a sulfur containing compound. The n-type window layers of this embodiment include copper-indium-sulfide, and copper-indium-selenium-sulfide. An aspect of this embodiment is an n-type window layer which includes multiple sublayers in which the concentration of sulfur in each successive sublayer is greater than in the previous sublayer.

A first embodiment of the present invention is a sputtering target which includes a sodium compound and at least one metal selected from of copper, indium and gallium. The target may include the sodium containing compound and one of indium, copper-indium, copper-gallium or copper-indium-gallium (i.e., CIG). The copper, indium and gallium may be in the form of an alloy while the sodium containing compound may be in solution in the alloy or in the alloy as inclusion regions. Preferably, the content of the sodium compound in the target is between 0.1 and 5 weight percent while the content of copper, indium, and gallium is between 95 and 99.9 weight percent. The sputtering target may, however, include small amounts of impurities that either do not materially affect or do not negatively affect the performance of CIGS (Na) layers deposited on a substrate by a sputtering process which uses the sputtering target. In an embodiment, the as-formed target may include small amounts of selenium, aluminum, sulfur or group VII or VIII elements present in a sodium salt.

FIG. 1 illustrates a sputtering apparatus that can be used for forming a compound semiconductor layer with the sputtering target of the first embodiment. One or more targets comprising copper, indium, gallium, and a sodium containing compound (e.g., targets 27c1 and 27c2) are located in a sputtering process module 22b, such as a vacuum chamber. While two targets are shown in FIG. 1, 1 to 8 targets may be used (e.g., six targets as shown in FIG. 4). The module 22b may include a pumping device 23 to provide the desired vacuum. In this non-limiting example, the targets 27c1 and 27c2 are powered by DC power sources 7. A CIGS layer may be deposited over a substrate 100, such as a moving web substrate, by reactively sputtering the layer from targets 27c1, 27c2 in an atmosphere that comprises a sputtering gas (e.g., argon gas) and a selenium-containing gas, such as evaporated selenium or hydrogen selenide gas. Alternatively, the sputtering may comprise reactively alternating current (AC) magnetron sputtering the compound semiconductor layer from at least one pair of two conductive targets 27c1 and 27c2, in a sputtering atmosphere that comprises argon gas and a selenium-containing gas. In some embodiments, the conductive targets 27c1 and 27c2 comprise the same target materials. For example, each of the at least two conductive targets 27c1 and 27c2 may comprise copper, indium, gallium and a sodium containing compound, or copper, indium, aluminum and a sodium containing compound. The sputtering target, for example, may have a composition of about 29-41 wt % copper, including 29-39 wt % Cu, about 36-62 wt % indium, including 49-62 wt % In, about 8-25 wt % gallium, including 8-16 wt % Ga, and about 0.1 and 5 wt % sodium containing compound. In other embodiments, targets 27c1 and 27c2 may comprise different materials from each other as will be described below. Radiation heaters 30 maintain the substrate 100 at the required process temperature, for example, around 400-800° C., for example around 500-700° C., which is preferable for the CIS based alloy deposition.

In an embodiment, the sputtering targets 27c1, 27c2 may have a cylindrical shape. The sputtering targets 27c1, 27c2 may be a cylindrical shell formed on a cylindrical sputtering target support (e.g., a backing tube, such as a stainless steel, titanium, aluminum or other non-magnetic backing tube). Alternatively, the targets may comprise a hollow cylinder or hollow rings ring made without the backing tube. The cylinder or rings may be made in a mold or on a temporary support and then attached to the backing tube which houses the magnet(s), as described for example in U.S. application Ser. No. 12/588,578, filed on Oct. 20, 2009, and incorporated herein by reference in its entirety. Alternatively, planar targets may be used instead.

The sodium containing compound may be a sodium salt, such as a halogen salt or a chalcogen salt. Exemplary sodium containing compounds include, but are not limited to, sodium fluoride, sodium chloride, sodium molybdate, sodium selenide, sodium hydroxide, sodium oxide, sodium sulfate, sodium selenate, sodium sulfide, sodium sulfite, sodium tungstate, sodium titanate, sodium metavanadate, and sodium orthovanadate. As noted above, the salt may contain a transition metal in addition to the halogen or chalcogen. Example transition metals that may be contained in the salt include Mo, Ti, W, etc.

Another embodiment of the present invention is a method of making a sputtering target of copper, indium, gallium and sodium compound containing material. Exemplary methods include casting, injection molding, twin arc wire spraying (TWAS), plasma spraying and powder metallurgy.

Examples of casting processes (e.g., dip casting, vacuum mold casting, semi-solid casting, direct strip casting, centrifugal casting, continuous casting, squeeze casting, etc.) and injection molding processes are described in U.S. application Ser. No. 12/588,578, filed on Oct. 20, 2009, and incorporated herein by reference in its entirety. In the casting and injection molding processes, the copper, indium, gallium and sodium containing compound may be combined at a temperature high enough to form a liquid melt. For example, a sodium compound, such as a sodium salt, is added to a copper, indium and gallium containing melt to form a liquid sputtering material. The liquid is then solidified onto the target support which may be located in a mold or in other suitable casting or molding liquid receiving positions.

Alternatively, the copper, indium, gallium and sodium containing compound may be combined at a temperature suitable for forming a thixotropic slurry. Thixotropic metal melts as used herein are those in which the viscosity of the melt is lowered by mixing as the melt cools. Instead of forming interlocking dendrites on cooling, the precipitating solids have a more rounded, spheroidal shape allowing the melt to flow even at temperatures at which it would otherwise be semisolid. In one aspect, the copper, indium and gallium are combined at an appropriate thixotropic temperature in a container (e.g., melting chamber or melting pot) and then the sodium containing compound is added to this thixotropic slurry. Preferably, the thixotropic slurry is stirred by a stirrer or fin located in the chamber or pot prior to casting or injection molding.

Further, as discussed above, the sputtering target may be either formed on a target support or a hollow cylinder or ring made without a backing tube. Thus, embodiments of the present invention include casting and injection molding both supported sputtering targets (i.e., cast or molded onto the backing tube) and unsupported targets (not cast or molded with the backing tube as part of the casting mold).

As with the casting and injection molding embodiments, the TWAS method may be used to form both supported sputtering targets and unsupported. Additionally, the TWAS method may use compound wires. That is, wires that have a distinct core and shell made of different materials. In one embodiment, the core is made of a copper indium gallium alloy that includes a sodium containing compound. The surrounding shell may be made of a copper indium gallium alloy which contains no sodium or less sodium than the wire core. Alternatively, the shell is made of a copper indium gallium alloy that includes a sodium containing compound and the core is made of a copper indium gallium alloy which contains no sodium or less sodium than the shell.

Powder metallurgy processes include both hot pressing and cold pressing. If desired, the sodium salt may be obtained as a fine powder or crushed to a fine powder under a controlled atmosphere (e.g., crushing in an inert gas, such as argon or nitrogen, filled glovebox). In either process, the starting material may be powders of the individual copper, indium and gallium elements and the sodium containing compound. However, gallium is a liquid at room temperature. Therefore, the starting materials may preferably include alloys of gallium such as InGa, CuGa, and CuInGa (i.e., a copper, indium and gallium alloy). In another example, a copper powder, indium powder and copper-gallium alloy powder may be mixed with a sodium salt powder, preferably under the above described control atmosphere.

The starting materials may be mixed in the desired ratios and then pressed to form an unsupported sputtering target (i.e., pressed onto a temporary support and then attached to the backing tube) or pressed onto a sputtering support (e.g., backing tube). The pressing may be warm or cold, uniaxial or isostatic.

In another embodiment, the sodium containing compound is provided in solution. For example, a sodium salt, such as NaCl or NaF is mixed with a solvent, such as water to form a solution (e.g., salt water). In this embodiment, the powders of Ga, In and Cu (or their alloys) are mixed with the solution and then the solvent (e.g., water) is evaporated, leaving a sodium salt in the powder mixture. The evaporation may be conducted by heating the suspension comprising the salt solution and Cu, In and Ga containing (e.g., CIG) powder while agitating (e.g., tumbling or blending) the suspension. The heating may be conducted under vacuum or under forced air. The sodium salt may crystallize on the CIG powder particles. If the heating temperature is sufficiently low, then the salt may crystallize as a hydrate. Thus, a separate heating step may be conducted to dehydrate the salt.

Preferably, the sputtering targets made by the above methods exclude non-trace amounts of selenium prior to being used in a sputtering apparatus. Such targets may be advantageously used in a reactive sputtering process with an atmosphere that includes evaporated selenium or hydrogen selenide to form CIGS(Na) layers.

Another embodiment includes a method of making a photovoltaic device. The method includes a step of forming a compound semiconductor layer comprising copper, indium, gallium, selenium and sodium by reactive sputtering at least one first target comprising copper, indium, gallium and a sodium compound as described above in an atmosphere comprising selenium. The compound semiconductor layer may be a sodium doped first p-type copper indium gallium selenide absorber layer. The method may further include steps of forming a first electrode on a substrate below the first p-type copper indium gallium selenide absorber layer (i.e., the first electrode is formed prior to the p-CIGS(Na) layer with the p-CIGS(Na) being formed over the first electrode), forming an n-type window semiconductor layer over the first p-type copper indium gallium selenide absorber layer, and forming a transparent electrode over the n-type window semiconductor layer. In an embodiment, a p-n junction is formed between the n-type window semiconductor layer and the first p-type copper indium gallium selenide absorber layer. In an embodiment of the method, a web substrate may be moved though a plurality of sputtering chambers. In one aspect of this embodiment, the compound semiconductor layer is formed in one chamber of the plurality of chambers.

Figure 3:
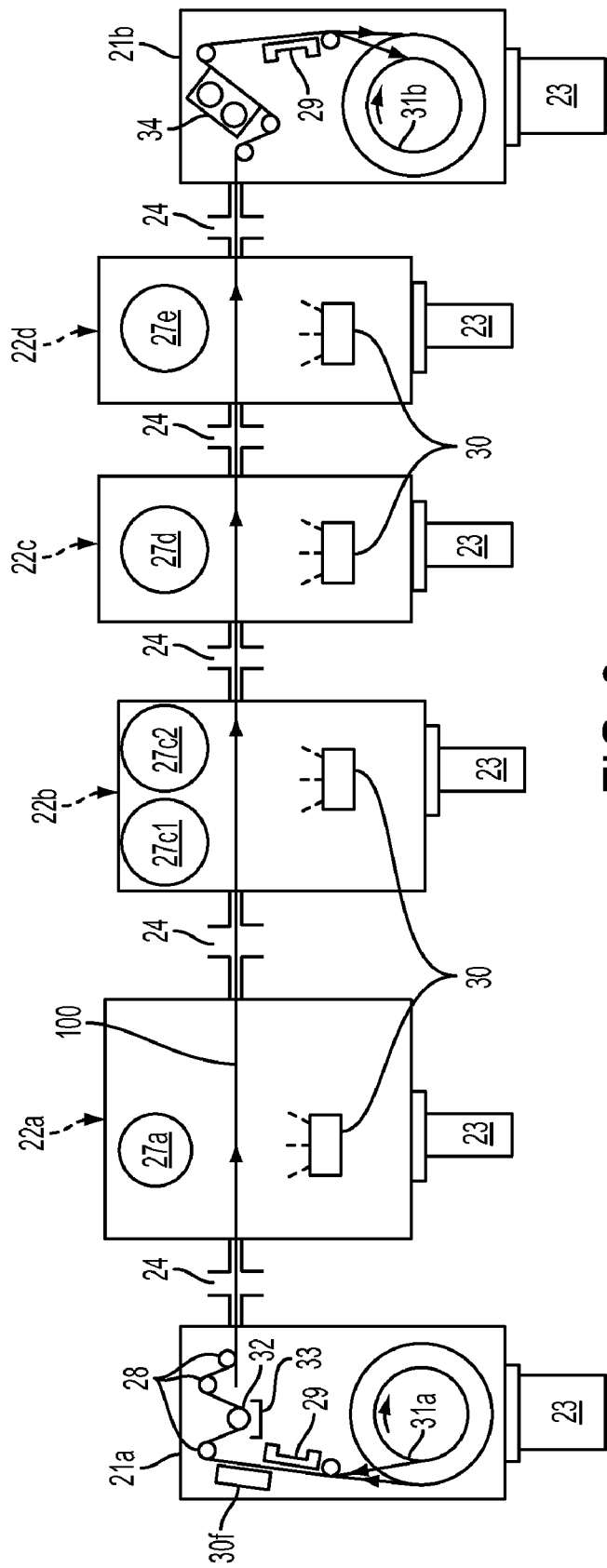
FIG. 3 illustrates a highly simplified schematic diagram of a top view of a modular sputtering apparatus that can be used to manufacture the solar cell depicted in FIG. 2.
Figure 4:
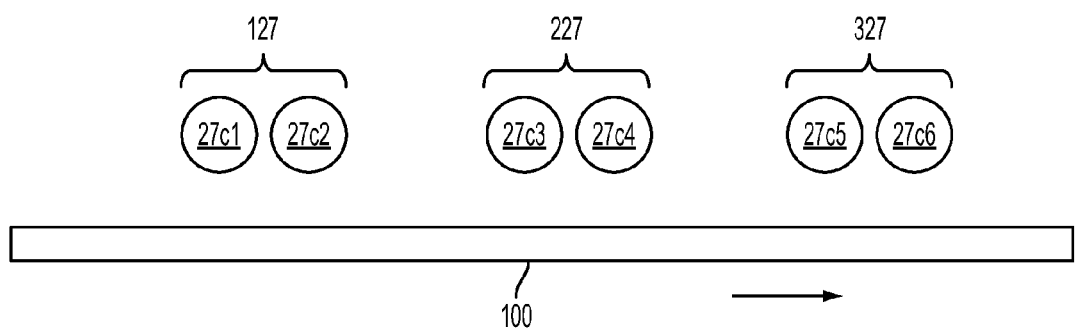
FIG. 4 illustrates schematically the use of three sets of dual magnetrons to increase the deposition rate and grade the composition of the CIGS layer to vary its band gap.

FIG. 3 illustrates a modular sputtering apparatus that may be used for depositing the layers for making a photovoltaic device. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

The web substrate 100 is moved throughout the machine by rollers 28, or other devices. Additional guide rollers may be used. Rollers shown in FIG. 3 are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules or cells by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps laid out across the width of the web. Infrared sensors provide a feedback signal to servo the lamp power and provide uniform heating across the web. In one embodiment, as shown in FIG. 3, the heaters are placed on one side of the web 100, and sputtering targets 27a-e are placed on the other side of the web 100. Sputtering targets 27 may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the process module 22a through valve 24. Following the direction of the imaginary arrows along the web 100, the full stack of layers may be deposited in one continuous process. The first electrode 200 may be sputtered in the process module 22a over the web 100, as illustrated in FIG. 3. Optionally, the process module 22a may include more than one target (e.g., for sputtering barrier and/or adhesion layers).

The compound semiconductor layer may be made by (1) depositing the sodium doped first p-type copper indium gallium selenide absorber layer over the first electrode by sputtering a first target comprising copper, indium, gallium and the sodium containing compound (such as a sodium-transition metal-halogen or sodium-transition metal-chalcogen salt and (2) depositing a second p-type copper indium gallium selenide absorber layer over the sodium doped first p-type copper indium gallium selenide absorber layer by sputtering from a second target that comprises copper, indium, gallium and either no sodium or a lower amount of sodium than the at least one first target. Preferably, the second p-type copper indium gallium selenide absorber layer contains no sodium or a lower sodium content that the sodium doped first p-type copper indium gallium selenide absorber layer. If the sodium salt contains molybdenum (e.g., $NaMoO_4$, etc.), then the first p-type CIGS(Na) should be deposited on a first electrode that comprises Mo. Thus, in this embodiment, most or all of the sodium is provided into the bottom sublayer of the p-CIGS absorber. Since the bottom sublayer is located adjacent to a transition metal lower electrode, the sodium salt may include the same transition metal as the lower electrode.

Alternatively, most or all of the sodium may be provided from the upper portion or sublayer of the p-CIGS absorber. In this embodiment, the sodium salt preferably lacks the transition metal since the upper portion or sublayer is located adjacent to the p-n junction and distal from the lower electrode. Thus, the compound semiconductor layer may be formed by a method that include the steps of (1) depositing a first p-type copper indium gallium selenide absorber layer over the first electrode by sputtering from a target that comprises copper, indium, gallium and either no sodium or a lower amount of sodium than a successive target and (2) depositing a second sodium doped p-type copper indium gallium selenide absorber layer over the first p-type copper indium gallium selenide absorber layer by sputtering from a target comprising copper, indium, gallium and a higher amount of the sodium containing compound than in the first target. In this embodiment, the sodium containing compound preferably does not include molybdenum.

The substrate 100 may be a foil web, for example, a metal web substrate, a polymer web substrate, or a polymer coated metal web substrate, and may be continuously passing through the sputtering module 22b during the sputtering process, following the direction of the imaginary arrow along the web 100. Any suitable materials may be used for the foil web. For example, metal (e.g., stainless steel, aluminum, or titanium) or thermally stable polymers (e.g., polyimide or the like) may be used. The foil web 100 may move at a constant or variable rate to enhance deposition.

The web 100 may then pass into the process modules 22c and 22d, for depositing the n-type semiconductor layer 302, and the transparent top electrode 400, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more anti-reflection (AR) layers.

Finally, the web 100 passes into output module 21b, where it is either wound onto the take up spool 31b, or sliced into solar cells using cutting apparatus 29. While sputtering was described as the preferred method for depositing all layers onto the substrate, some layers may be deposited by MBE, CVD, evaporation, plating, etc., while, preferably, the CIS based alloy is reactively sputtered.

Figure 2:
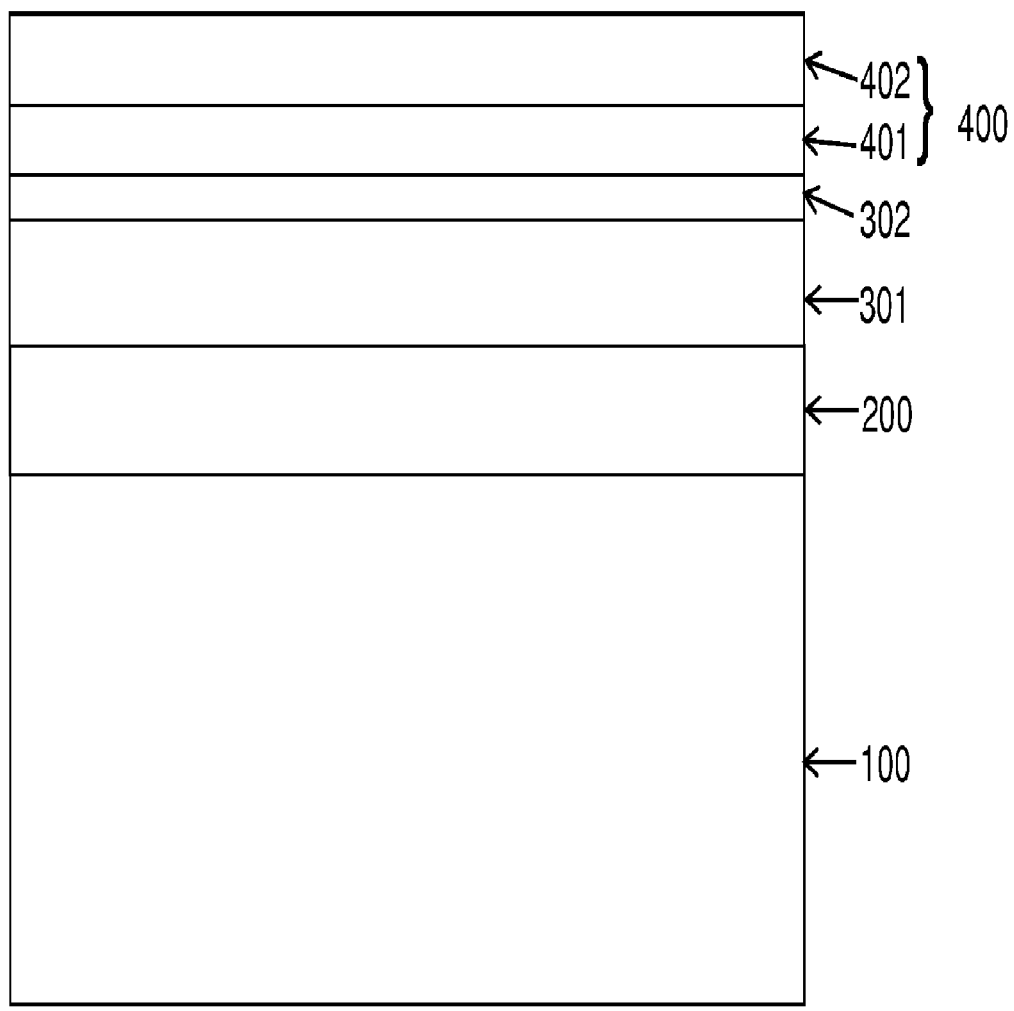
FIG. 2 is a schematic side cross-sectional view of a CIGS based solar cell according to one embodiment of the invention.

FIG. 2 illustrates a solar cell that may be made by embodiments of the methods discussed above. The solar cell contains the substrate 100 and a first (lower) electrode 200. The first electrode may comprise a transition metal, for example, one of Mo, W, Ta, V, Ti, Nb, Zr, or alloys thereof. In one embodiment, the step of depositing the first electrode 200 may comprise DC sputtering a first target 27a comprising a transition metal, such as molybdenum. Optionally, the first electrode 200 of the solar cell may comprise one or more barrier layers (not shown) located at the bottom of the electrode 200, and/or one or more adhesion layers (not shown) located on top of the electrode 200. The barrier layer 201 substantially prevents alkali diffusion into the substrate 100. The optional barrier layer and adhesion layer may comprise any suitable materials. For example, they may be independently selected from a group consisting Mo, W, Ta, V, Ti, Nb, Zr, Cr, TiN, ZrN, TaN, VN, $V_2N$ or combinations thereof.

Over the first electrode 200 is a p-type semiconductor absorber layer 301 comprising CIGS(Na). Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom (e.g., 0.8 to 0.99 copper atoms) for each one of Group III atom and each two of Group VI atoms. The step of depositing the at least one p-type semiconductor absorber layer may comprise reactively DC sputtering or reactively AC sputtering the semiconductor absorber layer from at least two electrically conductive targets 27c1, 27c2 in a sputtering atmosphere that comprises argon gas and a selenium containing gas (e.g. selenium vapor or hydrogen selenide as described with respect to FIG. 1). An n-type semiconductor layer 302 may then be deposited over the p-type semiconductor absorber layer 301. The n-type semiconductor layer 302 may comprise any suitable n-type semiconductor "window" materials, for example, but not limited to ZnS, ZnSe or CdS.

A second electrode 400, also referred to as a transparent top electrode, is further deposited over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO.

Optionally, one or more antireflection (AR) films (not shown) may be deposited over the transparent top electrode 400, to optimize the light absorption in the cell, and/or current collection grid lines may be deposited over the top conducting oxide.

Alternatively, the solar cell may be formed in reverse order. In this configuration, a transparent electrode is deposited over a substrate, followed by depositing an n-type semiconductor layer over the transparent electrode, depositing at least one p-type semiconductor absorber layer over the n-type semiconductor layer, and depositing a top electrode comprising an alkali-containing transition metal layer over the at least one p-type semiconductor absorber layer. The substrate may be a transparent substrate (e.g., glass) or opaque (e.g., metal). If the substrate used is opaque, then the initial substrate may be delaminated after the steps of depositing the stack of the above described layers, and then bonding a glass or other transparent substrate to the transparent electrode of the stack.

More preferably, the steps of depositing the first electrode 200, depositing the at least one p-type semiconductor absorber layer 301, depositing the n-type semiconductor layer 302, and depositing the second electrode 400 comprise sputtering in corresponding process modules of a plurality of independently isolated, connected process modules without breaking vacuum, while passing the web substrate 100 from an input module to an output module through the plurality of independently isolated, connected process modules such that the web substrate continuously extends from the input module to the output module while passing through the plurality of the independently isolated, connected process modules as shown in FIG. 3. Each of the process modules may include one or more sputtering targets for sputtering material over the web substrate 100.

In some embodiments, at least one p-type semiconductor absorber layer 301 may comprise graded CIS based material. In this embodiment, the process module 22b further comprises at least two more pairs of targets (227, and 327), as illustrated in FIG. 4. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIS based material is described in the Hollars published application, which is incorporated herein by reference in its entirety.

Optionally, one or more process modules (not shown) may be added between the process modules 21a and 22a to sputter a back side protective layer over the back side of the substrate 100 before the electrode 200 is deposited on the front side of the substrate. U.S. application Ser. No. 12/379,428 entitled "Protective Layer for Large-Scale Production of Thin-Film Solar Cells" and filed on Feb. 20, 2009, which is hereby incorporated by reference, describes such deposition process. Further, one or more barrier layers may be sputtered over the front side of the substrate 100 in the process module(s) added between the process modules 21a and 22a. Similarly, one or more process modules (not shown) may be added between the process modules 22a and 22b, to sputter one or more adhesion layers between the electrode 200 and the CIGS layer 301. Alternatively, the adhesion layers may be sputtered in the same chamber 22a using a second, different sputtering target from target 27a.

Another embodiment of the invention relates to a method of making a photovoltaic device in which the CIGS layer contains sulfur. This method is similar to the methods of making photovoltaic device in which the CIGS layer contains sodium discussed above. The method includes the step of forming a compound semiconductor layer that includes copper, indium, gallium, selenium and sulfur by reactive sputtering from a target that includes copper, indium, gallium and a sulfur compound in an atmosphere comprising selenium. Typically, the compound semiconductor layer formed by this method is a p-type copper indium gallium sulfur selenide absorber layer. The method may also include a steps of (1) forming the first electrode 200 below the p-type copper indium gallium sulfur selenide absorber layer 301 (that is, the first electrode is formed prior forming the p-type CIG(Se,S) absorber layer), (2) forming an n-type window semiconductor layer 302 over the p-type copper indium gallium sulfur selenide absorber layer 301 and (3) forming a transparent electrode 400 over the n-type window semiconductor layer as shown in FIG. 2. Because the absorber layer (p-type) and the window layer (n-type) have different doping, a p-n junction is formed between the window layer and the absorber layer.

As in the previous device fabrication embodiments discussed above, devices with sulfur containing CIGS layers may be made in the apparatus illustrated in FIG. 3. That is, the device may be made by moving a web substrate 100 though a plurality of sputtering chambers 22.

The p-type absorber layer 301 may be made by reactive sputtering from a copper indium gallium sulfur compound containing target in a selenium containing atmosphere. The n-type window semiconductor layer 302 may be formed by sputtering an n-CdS layer or by sputtering an n-type copper indium sulfur selenide layer or a copper indium sulfide layer by reactive or non-reactive sputtering, as will be discussed in more detail below.

The p-type absorber layer may include sodium in addition to sulfur. This p-type absorber layer may be made by sputtering from sputtering targets in which the sulfur and the sodium compounds are in the same sputtering target. Salts that include both sodium and sulfur include, but are not limited to, $Na_2S$ and $Na_2SO_3$. Separate sodium and sulfur salts may also be used in the same sputtering target. Alternatively, a pair of sputtering targets may be used in which the sulfur compound is in one target and the sodium compound is in the other target.

Another embodiment of the invention relates to sputtering targets comprising a sulfur compound. In one aspect, the sputtering target comprises indium and a sulfur compound. Alternatively, the target may include indium and at least one of copper, gallium and selenium (e.g., a copper-indium-gallium alloy or a copper-indium alloy). Sulfur compounds that may be used to make sputtering targets of this embodiment include $CuS$, $Cu_2S$, $Na_2S$, $Na_2SO_3$, $GaS$, $In_2S_3$, $Se_2S_6$, $S_7NH$, and $N_4S_3F_3$. The sputtering targets preferably have a sulfur concentration in a range of 5 to 40 at %, such as 5-15 at %.

Another embodiment relates to a method of making a sputtering target containing sulfur. One embodiment of the method includes the steps of (1) combining an indium containing material and a sulfur containing compound to form a combined sputtering material and (2) providing the combined sputtering material onto a target support to form an indium and sulfur compound containing target. As with the sodium containing sputtering targets discussed above, unsupported targets may be made as well. Further, as with the sodium containing sputtering targets, the sulfur containing sputtering targets may be formed by casting, injection molding, twin arc wire spraying (TWAS), plasma spraying or powder metallurgy, as described above with respect to the sodium salt embodiment.

Another embodiment relates to the photovoltaic device having a p-CIGS absorber 301 and a sulfur containing n-CIS type window layer 302. A method of making the sulfur containing n-type window layer of the photovoltaic device includes sputtering with a target which includes a sulfur containing compound. The CIS type n-type window layer of this embodiment includes copper-indium-sulfide, and copper-indium-selenium-sulfide. Preferably, gallium is excluded from the target and the n-CIS type window layer 302. For example, the p-type CIGS layer 301 is copper deficient, while the n-type CIGS layer 302 contains sulfur. Therefore, while the layers 301 and 302 have a different composition, they are both CIS type layers which allows the p-n junction to be similar to a homojunction rather than a heterojunction.

Figure 5:
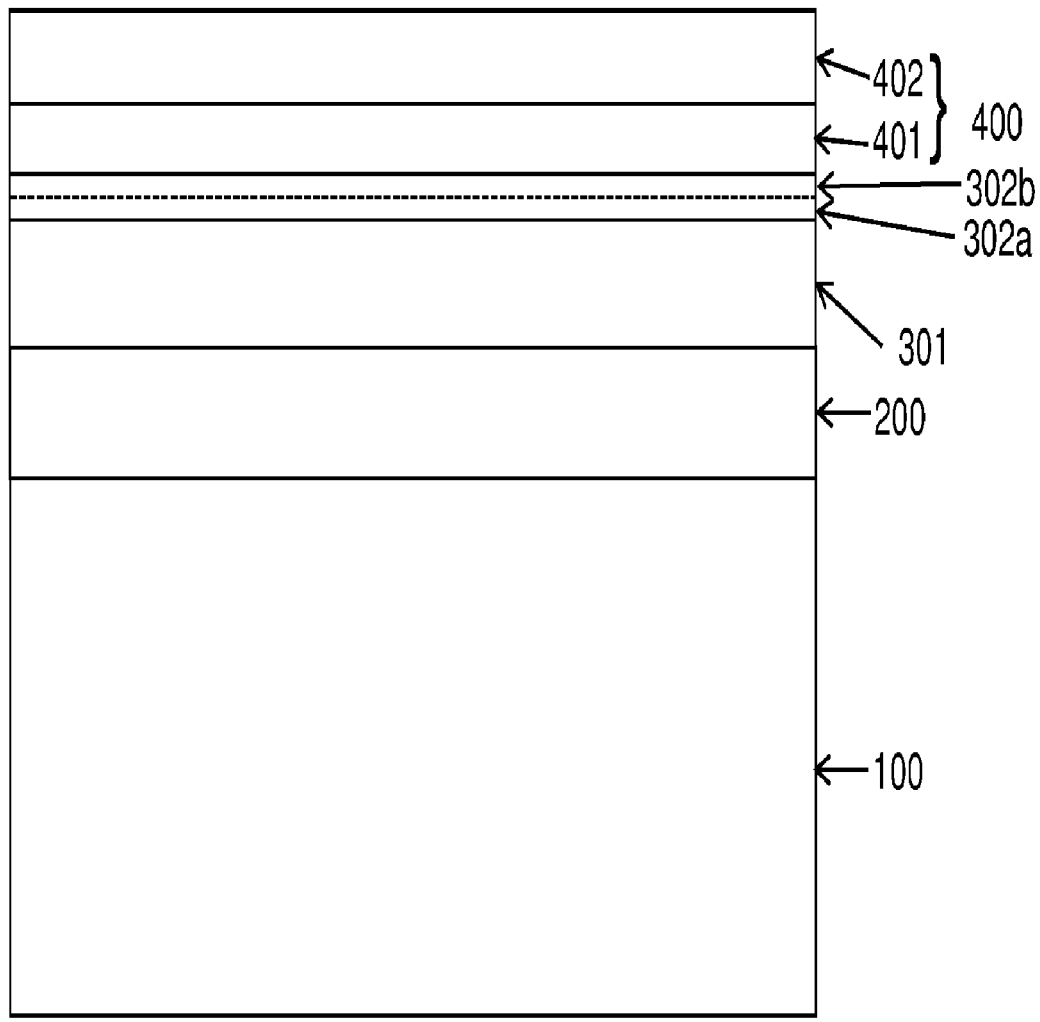
FIG. 5 is a schematic side cross-sectional view of a CIGS based solar cell with a graded copper concentration according to an embodiment of the invention.

An aspect of this embodiment is an n-type window layer which includes multiple sublayers in which the concentration of sulfur in each successive sublayer is greater than in the previous sublayer as illustrated in FIG. 5. The method includes steps of providing a substrate, depositing a first electrode layer 200 over the substrate 100, sputter depositing a first compound semiconductor layer 301 comprising copper, indium, gallium and selenium over the first electrode layer 200, sputter depositing a second compound semiconductor layer 302a1302b comprising copper, indium and sulfur over the first compound semiconductor layer 301 and depositing a second electrode 400 over the second compound semiconductor layer, as shown in FIG. 3 for example. In one aspect, the second compound semiconductor layer 302 has a higher bandgap than the first compound semiconductor layer 301.

The second compound semiconductor layer 302a/302b may be sputter deposited from a sputtering target comprising sulfur, copper and indium, such as the sputtering targets discussed in more detail above. The sputtering target may further comprise selenium and/or selenium may be present in ambient. The sulfur containing sputtering target may contain a sulfur compound, such as a sulfur salt, as described in the previous embodiment directed to sulfur salt containing targets.

The second compound semiconductor layer 302a/302b may comprise a series of compound semiconductor sublayers 302a, 302b of copper, indium, and sulfur. Preferably, the concentration of sulfur in each successive sublayer 302a, 302b of the series of sublayers 302a, 302b is greater than in the preceding sublayer 302a, 302b.

The second compound semiconductor layer 302a/302b may be formed by sequentially passing the substrate 100 past a series of targets (27c1-27c6 in FIG. 4) in which each successive target contains more sulfur than the preceding target. The content of sulfur in the second compound semiconductor layer may be 5-40 at %, such as 5-15 at % while the copper to indium ratio may be 0.7-0.95 at %. In an embodiment, the content of chalcogen (e.g., S and/or Se) in layer 302a/302b may be about 50 at % while the content of metal may be about 50%. Deposition of the first compound semiconductor layer may be performed in the first chamber by reactive sputtering copper indium gallium selenide from one or more copper-indium-gallium alloy targets in a selenium containing ambient, and deposition of the second compound semiconductor layer may be performed in a second chamber by non-reactive sputtering from the at least one target comprising copper-indium-sulfur, or copper-indium-sulfur-selenium or by reactive sputtering in a selenium containing ambient. When performing non-reactive sputtering, the sputtering target may have a sulfur content of 5-40 at %, such as 5-15%, and a Se content of 10-45 at %, such as 35-45 at % to make a content of chalcogen of about 50 at % and a content of metal of about 50% in the semiconductor layer. If the semiconductor layer lacks Se, then it may comprise up to 50 at % S. The semiconductor layer preferably has a copper:indium ratio of 0.7-0.95 at %.

Each layer or method step or target from each embodiment described above may be used in any suitable combination with one or more layers, method steps or targets from anyone or more other embodiments described above. Thus, the method may include forming a p-CIGS layer containing both sodium and sulfur by sputtering one or more sodium and/or sulfur salt containing targets, and forming a sulfur containing n-CIGS window layer.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

The invention claimed is:

1. A sputtering target comprising:
    at least one metal selected from a group consisting of copper, indium and gallium; and
    a sodium containing compound, wherein the target comprises an alloy of copper, indium and gallium as a metal matrix which includes the sodium containing compound, and wherein the sodium containing compound comprises a sodium and transition metal containing salt which is present as inclusion regions in the metal matrix.

2. The target of claim 1, wherein the sputtering target comprises between 0.1 and 5 weight percent sodium compound and 95 to 99.9 weight percent of the alloy of copper, indium and gallium.

3. The target of claim 1, wherein the target comprises a cylindrical target formed on a cylindrical sputtering target support.

4. The target of claim 1, wherein the sodium containing compound comprises one or more of sodium molybdate, sodium tungstate, sodium titanate, sodium metavanadate, or sodium orthovanadate.

5. A method of making a sputtering target, comprising providing onto a target support a sodium compound containing material and at least one metal selected from a group consisting of copper, indium and gallium to form the target, wherein the target comprises an alloy of copper, indium and gallium as a metal matrix which includes the sodium compound containing material; and
    the sodium compound containing material comprises a sodium and transition metal containing salt which is present as inclusion regions in the metal matrix, and the sputtering target comprises between 0.1 and 5 weight percent of the sodium compound and 95 to 99.9 weight percent of the alloy of copper, indium and gallium.

6. The method of claim 5, further comprising:
    combining a copper, indium and gallium containing material and a sodium containing compound to form a combined sputtering material comprising the copper, indium, gallium and sodium compound containing material; and
    providing the combined sputtering material onto a target support to form a copper, indium, gallium and sodium compound containing target.

7. The method of claim 6, wherein the copper, indium and gallium containing material comprises a mixture of copper powder, indium powder and copper-gallium alloy powder.

8. The method of claim 6, wherein the step of combining comprises combining a copper-indium-gallium powder and a powder of the sodium containing compound.

9. The method of claim 8, wherein the step of providing comprises pressing a powder of the combined sputtering material onto the target support.

10. The method of claim 8, wherein the step of combining comprises
combining the copper-indium-gallium powder with a sodium compound containing solution; and
evaporating a solvent from the solution.

11. The method claim 6, wherein the step of combining comprises combining a copper, indium and gallium containing melt with the sodium containing compound to form a liquid of the combined sputtering material; and the step of providing comprises solidifying the liquid onto the target support.

12. The method of claim 6, wherein the step of combining comprises combining a copper, indium and gallium containing thixotropic slurry with the sodium containing compound to form a thixotropic slurry of the combined sputtering material and stirring the thixotropic slurry of the combined sputtering material; and
the step of providing comprises casting or injection molding the stirred thixotropic slurry of the combined sputtering material onto the target support.

13. The method of claim 6, wherein the combined sputtering material comprises at least one wire and the step of providing comprises twin arc wire spray (TWAS) depositing the combined sputtering material onto the target support.

14. The method of claim 6, wherein the sodium containing compound comprises one or more of sodium molybdate, sodium tungstate, sodium titanate, sodium metavanadate, or sodium orthovanadate.

15. The method of claim 6, wherein the step of providing comprises plasma spraying.

16. The method of claim 5, wherein the as-formed target excludes non-trace amounts of selenium prior to being used in a sputtering apparatus.

17. A method of making a photovoltaic device, comprising forming a compound semiconductor layer comprising copper, indium, gallium, selenium and sodium by reactive sputtering at least one first target comprising copper, indium, gallium and a sodium compound in an atmosphere comprising selenium, wherein the at least one first target comprises an alloy of copper, indium and gallium as a metal matrix which includes the sodium compound and the sodium compound comprises a sodium and transition metal containing salt which is present as inclusion regions in the metal matrix.

18. The method of claim 17, wherein the compound semiconductor layer comprises a sodium doped first p-type copper indium gallium selenide absorber layer.

19. The method of claim 18, further comprising:
forming a first electrode below the first p-type copper indium gallium selenide absorber layer;
forming an n-type window semiconductor layer over the first p-type copper indium gallium selenide absorber layer; and
forming a transparent electrode over the n-type window semiconductor layer.

20. The method of claim 19, wherein a p-n junction is formed between the n-type window semiconductor layer and the first p-type copper indium gallium selenide absorber layer.

21. The method of claim 19, further comprising:
moving a web substrate though a plurality of sputtering chambers; and
forming the compound semiconductor layer in a first chamber of the plurality of chambers.

* * * * *